(12) United States Patent
Kim et al.

(10) Patent No.: US 11,036,134 B2
(45) Date of Patent: Jun. 15, 2021

(54) HIGH ETCH RESISTANCE SPIN-ON CARBON HARD MASK COMPOSITION AND PATTERNING METHOD USING SAME

(71) Applicant: YOUNG CHANG CHEMICAL CO., LTD, Gyeongsangbuk-do (KR)

(72) Inventors: Gi Hong Kim, Daegu (KR); Su Jin Lee, Daegu (KR); Seung Hyun Lee, Daegu (KR); Seung Hun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 295 days.

(21) Appl. No.: 16/341,244

(22) PCT Filed: Oct. 12, 2017

(86) PCT No.: PCT/KR2017/011211
§ 371 (c)(1),
(2) Date: Apr. 11, 2019

(87) PCT Pub. No.: WO2018/070785
PCT Pub. Date: Apr. 19, 2018

(65) Prior Publication Data
US 2019/0258163 A1    Aug. 22, 2019

(30) Foreign Application Priority Data
Oct. 13, 2016 (KR) .................. 10-2016-0132796

(51) Int. Cl.
*C08G 61/12* (2006.01)
*G03F 7/004* (2006.01)
(Continued)

(52) U.S. Cl.
CPC ............ *G03F 7/0048* (2013.01); *C08G 61/10* (2013.01); *C08G 61/124* (2013.01); *G03F 7/094* (2013.01); *G03F 7/162* (2013.01); *G03F 7/168* (2013.01)

(58) Field of Classification Search
CPC ........ G03F 7/0048; G03F 7/094; G03F 7/162; G03F 7/168; C08G 61/10; C08G 61/124
See application file for complete search history.

(56) References Cited

FOREIGN PATENT DOCUMENTS

KR    10-2012-0038447 A    4/2012
KR    10-2014-0127691 A    11/2014
(Continued)

OTHER PUBLICATIONS

English Translation of KR 2015-0098062 A; Gyu Min Lee; Published: Aug. 27, 2015 (Year: 2015).*

(Continued)

*Primary Examiner* — John A McPherson
*Assistant Examiner* — Richard David Champion
(74) *Attorney, Agent, or Firm* — Novick, Kim & Lee, PLLC; Jae Youn Kim

(57) ABSTRACT

Provided is a hard mask composition having high etching resistance suitable for use in a semiconductor lithography process, and particularly to a spin-on hard mask composition including a dibenzo carbazole polymer and to a patterning method of forming a hard mask layer by applying the composition on an etching layer through spin coating and performing a baking process. The hard mask according to the present invention has effects of exhibiting high solubility and superior mechanical properties, as well as high etching resistance to withstand multiple etching processes.

14 Claims, 1 Drawing Sheet

(51) Int. Cl.
*C08G 61/10* (2006.01)
*G03F 7/16* (2006.01)
*G03F 7/09* (2006.01)

(56) References Cited

FOREIGN PATENT DOCUMENTS

| KR | 20150098062 A | * | 8/2015 | |
| KR | 10-2016-0112847 A | | 9/2016 | |
| KR | 20160127864 A | * | 11/2016 | ........... C07D 333/76 |
| KR | 10-1777687 B1 | | 9/2017 | |
| WO | 2014-038483 A1 | | 3/2014 | |

OTHER PUBLICATIONS

English Translation of KR 2016-0127864 A; Seong Je Park; Published: Nov. 7, 2016 (Year: 2016).*
Self-Association of Organic Acids in Petroleum and Canadian Bitumen Characterized by Low- and High-Resolution Mass Spectrometry; Donald F. Smith, Tanner M. Schaub, Parviz Rahimi, Alem Teclemariam, Ryan P. Rodgers, and Alan G. Marshall Energy & Fuels 2007 21 (3), 1309-1316. (Year: 2007).*

* cited by examiner

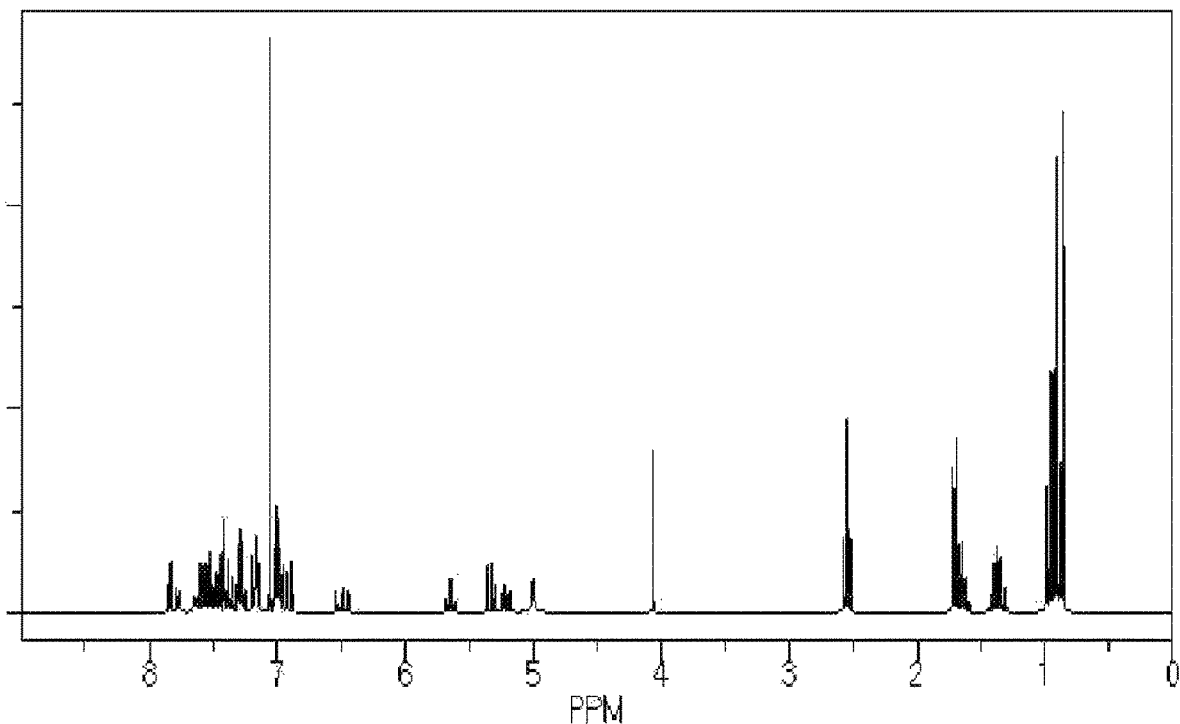

HIGH ETCH RESISTANCE SPIN-ON CARBON HARD MASK COMPOSITION AND PATTERNING METHOD USING SAME

TECHNICAL FIELD

The present invention relates to a hard mask composition having high etching resistance, suitable for use in a semiconductor lithography process, and particularly to a hard mask composition, which includes a dibenzo carbazole polymer having high etching resistance to withstand multiple etching processes, and to a patterning method.

BACKGROUND ART

With the recent trends toward miniaturization and integration of semiconductor devices, a fine pattern is required. In the formation of such a fine pattern, fining a photoresist pattern through the development of an exposure apparatus or the introduction of an additional process is regarded as effective.

In order to increase the density of integration of a semiconductor device and to enable the formation of a structure having dimensions on a nanometer scale, a photoresist having high resolution and a photolithography tool are being developed.

During the fabrication of a semiconductor in the past, a pattern has conventionally been formed on a semiconductor substrate using an i-line light source at a wavelength of 365 nm, but a light source in a smaller wavelength band is necessary in order to form a finer pattern.

A lithography technique using KrF (248 nm), ArF (198 nm) and EUV (Extreme Ultra Violet, 13.5 nm) light sources has been developed and has been commercialized or is currently being commercialized for real-world application, making it possible to realize a finer wavelength.

As the pattern size is smaller, the thickness of the photoresist is more and more decreased in order to prevent photoresist pattern collapse. Since an etching layer cannot be etched using an excessively thin photoresist pattern, a film referred to as a "hard mask" having superior etching resistance is interposed between the photoresist layer and the etching layer. The hard mask process is a process in which a hard mask is etched and patterned using a photoresist pattern, after which an etching layer is etched using the pattern of the hard mask. The hard mask film is manufactured through chemical vapor deposition (CVD) or spin-on coating.

A hard mask film, manufactured through CVD, has drawbacks such as increased initial costs due to the use of evaporators, elongated processing time, particle problems, etc., and thus many attempts have been made to reduce the cost and processing time using spin-coating materials for hard mask processing, rather than deposition.

A hard mask technique using a spin-on coating process is advantageous because initial costs are low compared to the CVD process, and also because coatability is uniform, the coating thickness may be easily controlled, and the processing time may be shortened.

Meanwhile, as increasingly fine semiconductor processing has recently become possible, the pattern linewidth is narrowed but the pattern height remains unchanged or becomes relatively high, resulting in an increased aspect ratio of the pattern. As the height of the hard mask layer increases, problems such as bowing occur during the etching process, making it difficult to properly perform the mask function due to insufficient etching selectivity. Hence, it is required to develop a novel hard mask material having improved etching characteristics.

DISCLOSURE

Technical Problem

Accordingly, the present invention is intended to provide a composition and a high-etching-resistant patterning method using a spin-on carbon hard mask during the fabrication of a semiconductor, and particularly a hard mask composition having high etching selectivity, sufficient resistance to multiple etching processes, and high solubility, and a patterning method using the composition.

Technical Solution

An embodiment of the present invention provides a spin-on hard mask composition, comprising a dibenzo carbazole derivative polymer represented by Chemical Formula 1 below or a structure including the same, and having a weight average molecular weight of 3,000 to 8,000.

[Chemical Formula 1]

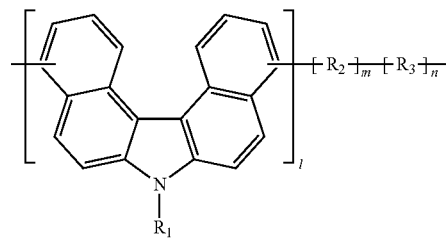

In Chemical Formula 1, l, m and n are $1 \leq l \leq 20$, $1 \leq m \leq 20$, and $1 \leq n \leq 20$, respectively, $R_1$ includes any one selected from among hydrogen (H),

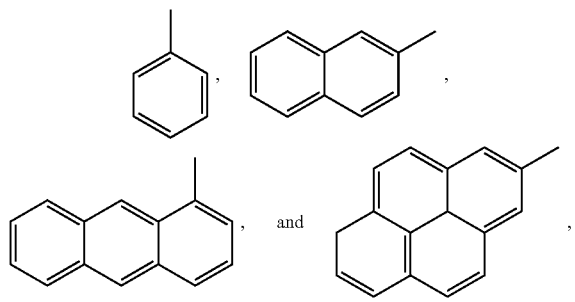

$R_2$ includes any one selected from among

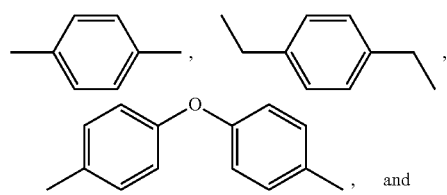

, and

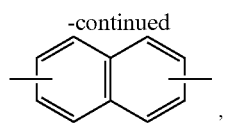

and R₃ includes any one selected from among

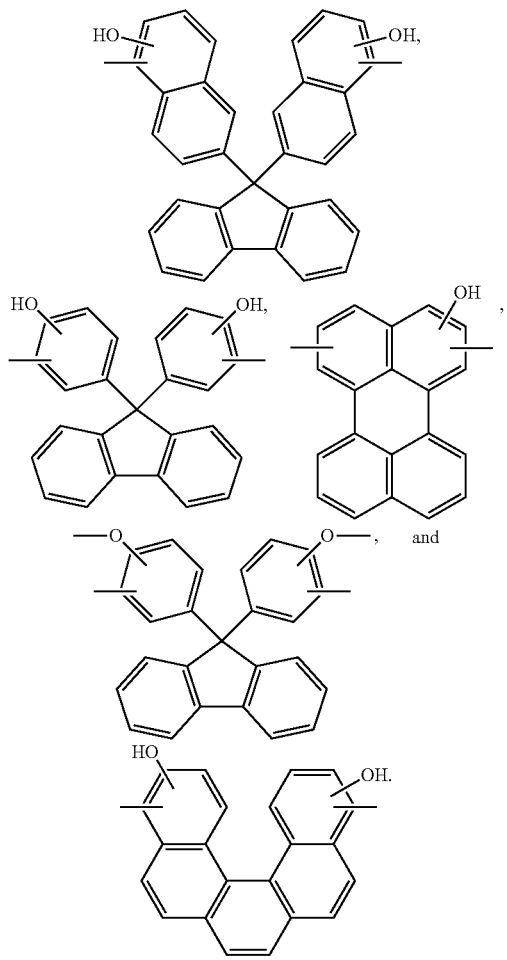

Another embodiment of the present invention provides a hard mask composition, comprising 1 wt % to 50 wt % of the polymer represented by Chemical Formula 1, 50 wt % to 99 wt % of an organic solvent, and 0 wt % to 2 wt % of a surfactant.

In this embodiment of the present invention, the organic solvent may be any one or a mixture of two or more selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

In this embodiment of the present invention, the surfactant may be any one or a mixture of two or more selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

Still another embodiment of the present invention provides a patterning method, comprising forming a hard mask layer by applying the above composition on an etching layer through spin coating and performing a baking process.

In this embodiment of the present invention, the baking process may be performed at a temperature of 150° C. to 400° C. for 1 min to 5 min, thus forming a pattern.

Advantageous Effects

According to the present invention, a hard mask composition having high etching resistance can exhibit high etching selectivity, sufficient resistance to multiple etching processes, and high solubility, and can thus realize superior performance upon formation of a semiconductor fine pattern.

BRIEF DESCRIPTION OF DRAWING

FIG. 1 shows ¹H-NMR spectrum of the polymer prepared in Example 2.

BEST MODE

Hereinafter, a detailed description will be given of the present invention.

The present invention pertains to a spin-on hard mask composition, comprising a dibenzo carbazole derivative polymer represented by Chemical Formula 1 below or a structure including the same, and having a weight average molecular weight of 3,000 to 8,000, preferably 3,500 to 7,000, and more preferably 5,000 to 6,000.

[Chemical Formula 1]

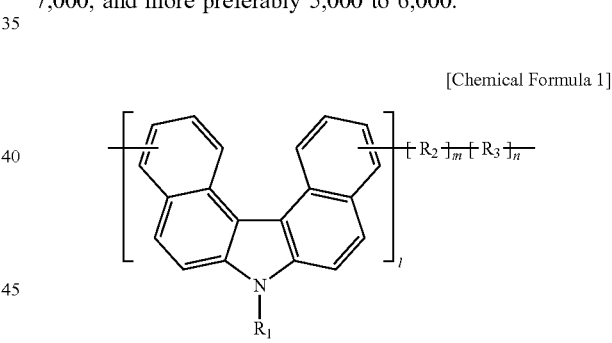

In Chemical Formula 1, l, m and n are $1 \leq l \leq 20$, $1 \leq m \leq 20$, and $1 \leq n \leq 20$, respectively, $R_1$ includes any one selected from among hydrogen (H),

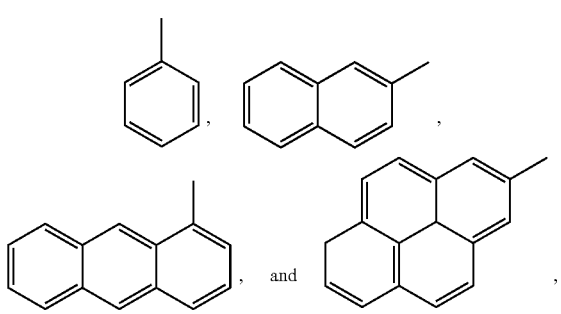

$R_2$ includes any one selected from among

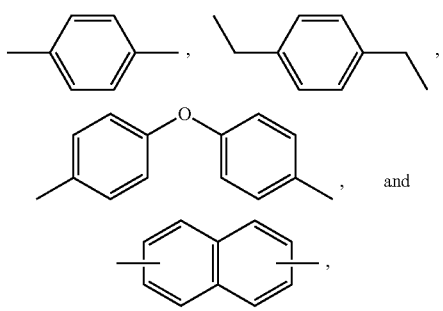

and and $R_3$ includes any one selected from among

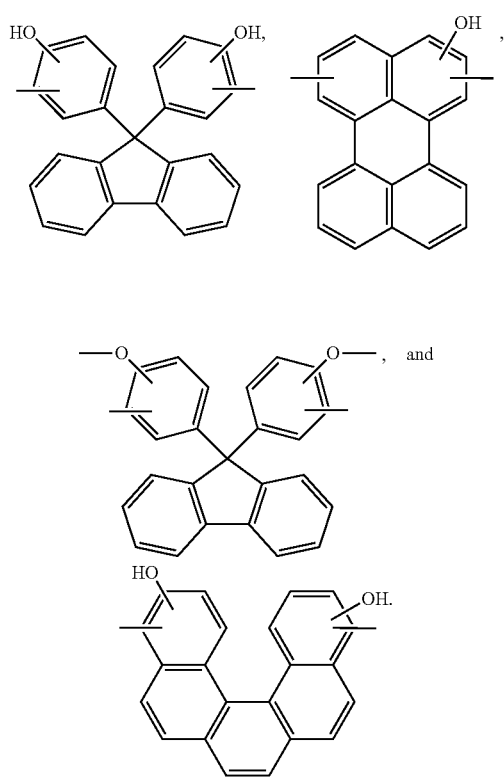

In Chemical Formula 1, $R_2$ is mainly used under an acid catalyst condition and plays the role of increasing the solubility of the formed polymer in an organic solvent.

In Chemical Formula 1, $R_3$ mainly plays the role of improving the thermosetting reactivity and etching selectivity of the entire polymer structure.

The polymer represented by Chemical Formula 1 has a weight average molecular weight of 3,000 to 8,000, preferably 3,500 to 7,000, and more preferably 5,000 to 6,000.

If the weight average molecular weight of the polymer represented by Chemical Formula 1 is less than 3,500, the polymer structure is not formed in a sufficient amount, thus decreasing etching resistance. On the other hand, if the weight average molecular weight thereof exceeds 7,000, the properties of the coated surface may become non-uniform.

The hard mask composition may comprise 1 wt % to 50 wt % of the polymer represented by Chemical Formula 1, 50 wt % to 99 wt % of an organic solvent, and 0 wt % to 2 wt % of a surfactant.

If the content of the polymer is less than 1 wt % or exceeds 50 wt %, the coating thickness may be less than or greater than a desired level, making it difficult to obtain an exact coating thickness. An excessive coating thickness may result in deteriorated coatability.

The organic solvent may be any one or a mixture of two or more selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

The surfactant may be any one or a mixture of two or more selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

The surfactant may function to decrease surface tension, thereby increasing spreadability or permeability to thus aid in coatability or gap-filling performance.

In addition, the present invention pertains to a patterning method, comprising forming a hard mask layer by applying the above composition on an etching layer through spin coating and performing a baking process.

The spin coating thickness of the composition is not particularly limited, but may fall in the range of 100 Å to 30,000 Å.

The baking process may be performed at a temperature of 150° C. to 400° C. for 1 min to 5 min. During the baking process, the composition may be subjected to self-crosslinking.

MODE FOR INVENTION

A better understanding of the present invention will be given through the following examples and comparative examples. However, these examples are merely set forth to illustrate the present invention but are not to be construed as limiting the present invention.

Example 1 <Synthesis of Dibenzo Carbazole-Based Cyclic Polymer>

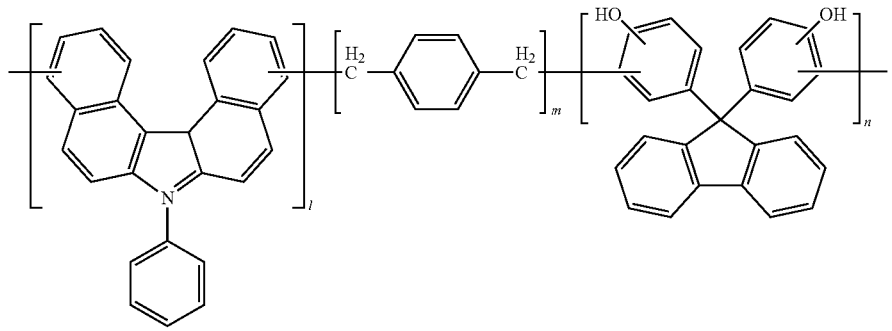

20 g of 7-phenyldibenzo[C,G]carbazole, 9.7 g of 1,4-bismethoxymethylbenzene, 20.4 g of 9,9-bis(4-hydroxyphenyl)fluorene, and 150 g of propylene glycol monomethyl ether acetate (PGMEA) were mixed together, and a nitrogen atmosphere was made. Then, 0.16 g of diethyl sulfate was added thereto, and the resulting solution was heated to 140° C. and then refluxed for 18 hr. After termination of the reaction, the resulting solution was purified with a hexane/methanol/water (1:1:1) solution, recrystallized using a methanol/water (10:1) solution, and dried in a vacuum, thereby yielding a polymer compound having a weight average molecular weight (Mw) of 5,500, as measured by GPC based on standard polystyrene.

Example 2

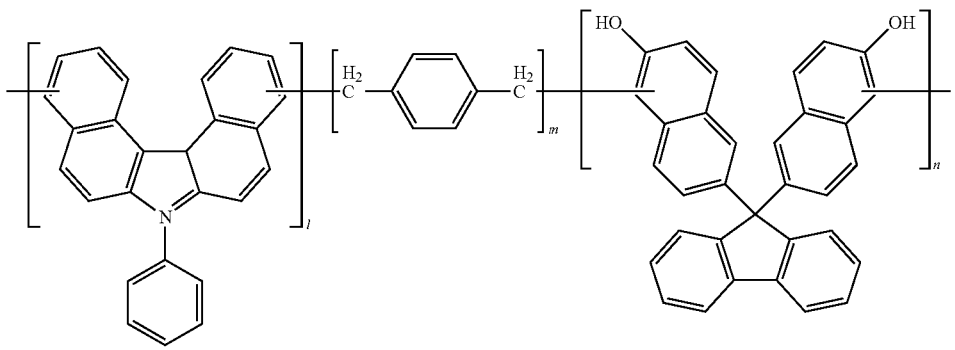

A polymer compound was synthesized in the same manner as in Example 1, with the exception that 26.2 g of 9,9-bis(6-hydroxy-2-naphthyl)fluorene was added in lieu of 9,9-bis(4-hydroxyphenyl)fluorene. The weight average molecular weight (Mw) of the polymer compound thus obtained was 5,300 as measured by GPC based on standard polystyrene.

Example 3

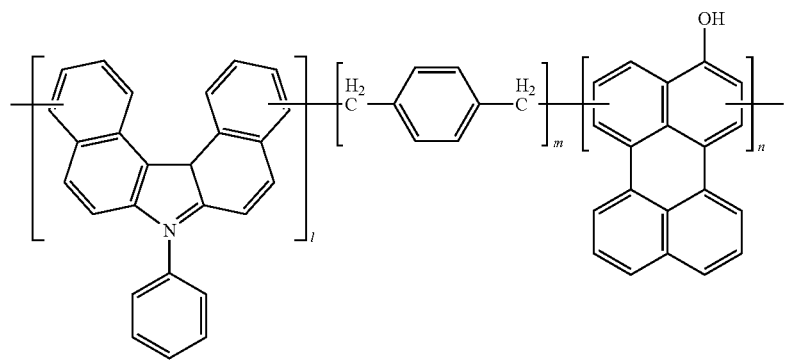

A polymer compound was synthesized in the same manner as in Example 1, with the exception that 15.6 g of 3-hydroxyperylene was added in lieu of 9,9-bis(6-hydroxy-2-naphthyl)fluorene. The weight average molecular weight (Mw) of the polymer compound thus obtained was 5,000 as measured by GPC based on standard polystyrene.

Example 4

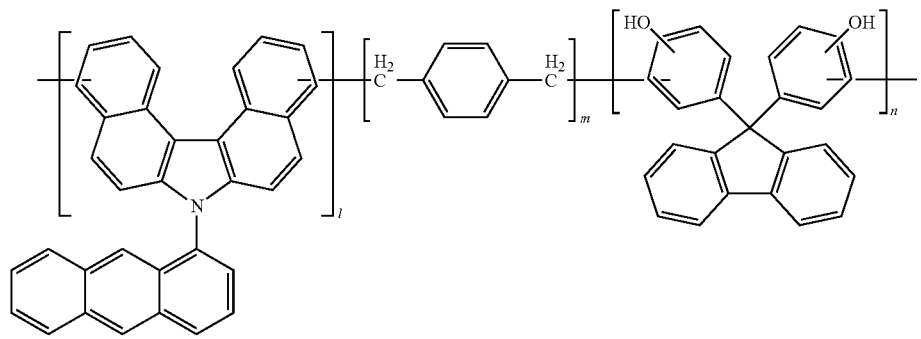

20 g of 7-(1-anthracenyl)dibenzo[C,G]carbazole, 7.5 g of 1,4-bismethoxymethylbenzene, 15.7 g of 9,9-bis(4-hydroxyphenyl)fluorene, and 150 g of propylene glycol monomethylether acetate (PGMEA) were mixed together. Then, the same synthesis procedures as in Example 1 were performed, thus obtaining a polymer compound, the weight average molecular weight (Mw) of which was 5,400 as measured by GPC based on standard polystyrene.

Example 5

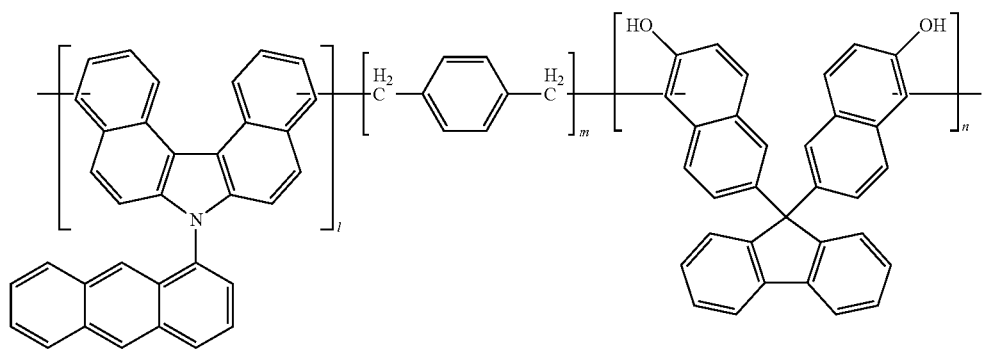

A polymer compound was synthesized in the same manner as in Example 4, with the exception that 20.2 g of 9,9-bis(6-hydroxy-2-naphthyl)fluorene was added in lieu of 9,9-bis(4-hydroxyphenyl)fluorene. The weight average molecular weight (Mw) of the polymer compound thus obtained was 5,700 as measured by GPC based on standard polystyrene.

Example 6

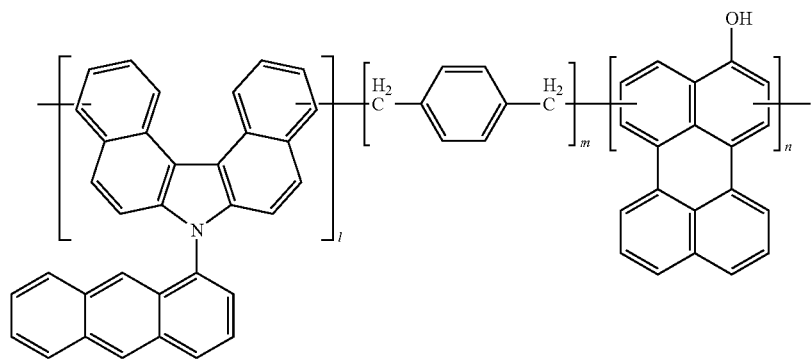

A polymer compound was synthesized in the same manner as in Example 4, with the exception that 12 g of 3-hydroxyperylene was added in lieu of 9,9-bis(6-hydroxy-2-naphthyl)fluorene. The weight average molecular weight (Mw) of the polymer compound thus obtained was 5,900 as measured by GPC based on standard polystyrene.

Example 7

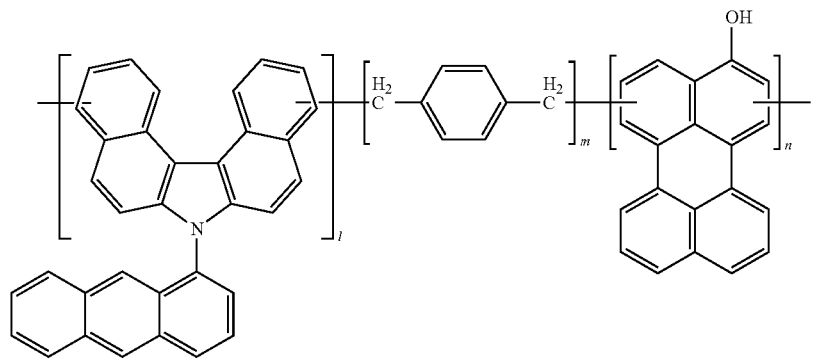

The same synthesis procedures as in Example 6 were performed, with the exception that the reaction time was set to 10 hr. The weight average molecular weight (Mw) of the polymer compound thus obtained was 3,500 as measured by GPC based on standard polystyrene.

Example 8

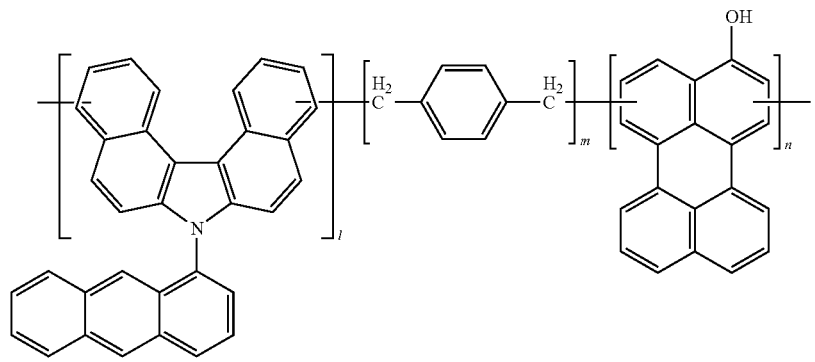

The same synthesis procedures as in Example 6 were performed, with the exception that the reaction time was set to 27 hr. The weight average molecular weight (Mw) of the polymer compound thus obtained was 7,000 as measured by GPC based on standard polystyrene.

Comparative Example 1

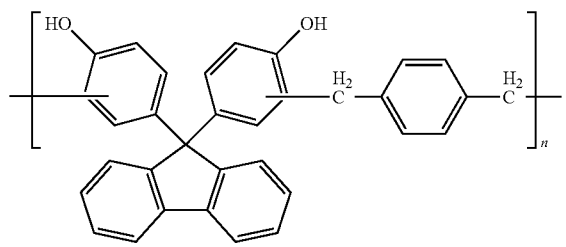

20 g of 9,9-bis(4-hydroxyphenyl)fluorene and 9.5 g of 1,4-bismethoxymethylbenzene were added with 70 g of PGMEA, after which 0.16 g of diethyl sulfate was added thereto. Then, the same synthesis procedures as in Example 1 were performed, thus obtaining a polymer compound, the weight average molecular weight (Mw) of which was 5,600 as measured by GPC based on standard polystyrene.

Comparative Example 2

The same synthesis procedures as in Comparative Example 1 were performed, with the exception that the reaction time was set to 10 hr. The weight average molecular weight (Mw) of the polymer compound thus obtained was 3,300 as measured by GPC based on standard polystyrene.

Comparative Example 3

The same synthesis procedures as in Comparative Example 1 were performed, with the exception that the reaction time was set to 27 hr. The weight average molecular weight (Mw) of the polymer compound thus obtained was 7,200 as measured by GPC based on standard polystyrene.

Test Example 1

2.5 g of the polymer compound obtained in Example 1 and 47.5 g of propylene glycol monomethylether acetate were added and stirred for one day and thus dissolved. The resulting solution was filtered with a 0.2 μm microfilter, thus preparing a composition for forming a hard mask film, which was then applied on a silicon wafer using a spin coater. Continuous heating at 240° C. for 1 min and at 400° C. for 1 min on a hot plate were conducted, thereby forming a hard mask film.

Test Example 2

The same procedures as in Test Example 1 were performed, with the exception that 2.5 g of the polymer compound obtained in Example 2 was used.

Test Example 3

The same procedures as in Test Example 1 were performed, with the exception that 2.5 g of the polymer compound obtained in Example 3 was used.

Test Example 4

The same procedures as in Test Example 1 were performed, with the exception that 2.5 g of the polymer compound obtained in Example 4 was used.

Test Example 5

The same procedures as in Test Example 1 were performed, with the exception that 2.5 g of the polymer compound obtained in Example 5 was used.

Test Example 6

The same procedures as in Test Example 1 were performed, with the exception that 2.5 g of the polymer compound obtained in Example 6 was used.

Test Example 7

The same procedures as in Test Example 1 were performed, with the exception that 2.5 g of the polymer compound obtained in Example 7 was used.

Test Example 8

The same procedures as in Test Example 1 were performed, with the exception that 2.5 g of the polymer compound obtained in Example 8 was used.

Comparative Test Example 1

The same procedures as in Test Example 1 were performed, with the exception that 2.5 g of the polymer compound obtained in Comparative Example 1 was used.

Comparative Test Example 2

The same procedures as in Test Example 1 were performed, with the exception that 2.5 g of the polymer compound obtained in Comparative Example 2 was used.

Comparative Test Example 3

The same procedures as in Test Example 1 were performed, with the exception that 2.5 g of the polymer compound obtained in Comparative Example 3 was used.

<Measurement of Weight Average Molecular Weight>

The weight average molecular weight of the polymer of each of the examples was measured using gel permeation chromatography (GPC). A GPC device made by WATERS was used, and the measurement conditions were as follows.

Column temperature: 40° C., mobile phase: tetrahydrofuran (THF), flow rate: 1 mL/1 min, GPC column: STYRAGEL KF-801, 802, 803 (made by WATERS, 8×300 mm).

<Test of Optical Properties>

The hard mask films formed in Test Examples 1 to 8 and Comparative Test Examples 1 to 3 were measured for refractive index n and extinction coefficient k. The results are shown in Table 1 below. Here, an ellipsometer (Horiba) was used.

TABLE 1

| Sample | Refractive index (n@193 nm) | Extinction coefficient (k@193 nm) |
|---|---|---|
| Example 1 | 1.51 | 0.53 |
| Example 2 | 1.52 | 0.53 |
| Example 3 | 1.52 | 0.52 |
| Example 4 | 1.53 | 0.52 |
| Example 5 | 1.53 | 0.53 |
| Example 6 | 1.54 | 0.53 |
| Example 7 | 1.56 | 0.58 |
| Example 8 | 1.57 | 0.59 |
| Comparative Example 1 | 1.44 | 0.69 |
| Comparative Example 2 | 1.44 | 0.70 |
| Comparative Example 3 | 1.43 | 0.69 |

<Evaluation of Dry-Etching Characteristics>

The hard mask films formed in Test Examples 1 to and Comparative Test Examples 1 to 3 were subjected to dry etching for 10 sec using $CF_4$ gas by means of a dry-etching device. The dry-etching rate was defined as [(film thickness before dry etching–film thickness after dry etching)/time]. The dry-etching characteristics show the dry-etching rate of a hard mark film when ACL (amorphous carbon layer) is taken as 100%, and the cross-section of the hard mask film was observed using FE-SEM (Hitachi). The results thereof are shown in Table 2 below.

TABLE 2

| Sample | | $CF_4$ etching relative to ACL |
|---|---|---|
| Test Example 1 | Example 1 | 90% |
| Test Example 2 | Example 2 | 93% |
| Test Example 3 | Example 3 | 92% |
| Test Example 4 | Example 4 | 90% |
| Test Example 5 | Example 5 | 91% |
| Test Example 6 | Example 6 | 90% |
| Test Example 7 | Example 7 | 78% |
| Test Example 8 | Example 8 | 78% |
| Comparative Test Example 1 | Comparative Example 1 | 80% |
| Comparative Test Example 2 | Comparative Example 2 | 70% |
| Comparative Test Example 3 | Comparative Example 3 | 71% |
| | ACL | 100% |

The invention claimed is:

1. A spin-on hard mask composition, comprising a dibenzo carbazole derivative polymer having a weight average molecular weight of 3,000 to 8,000 and represented by Chemical Formula 1 below:

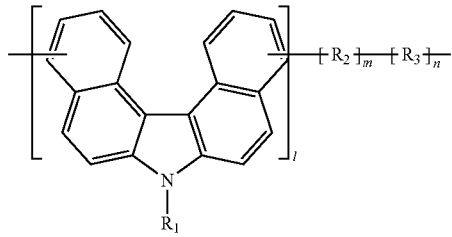

[Chemical Formula 1]

in Chemical Formula 1, l, m and n are $1 \leq l \leq 20$, $1 \leq m \leq 20$, and $1 \leq n \leq 20$, respectively, $R_1$ includes any one selected from among hydrogen (H),

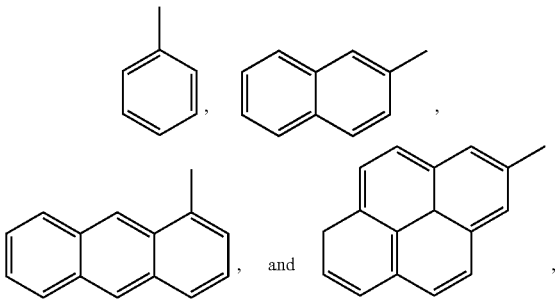

$R_2$ includes any one selected from among

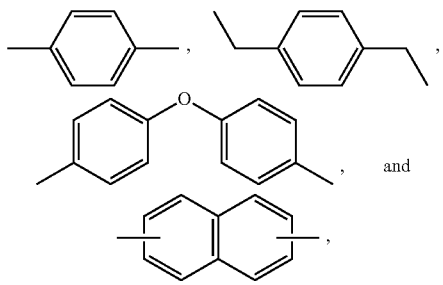

and R₃ includes
any one selected from among

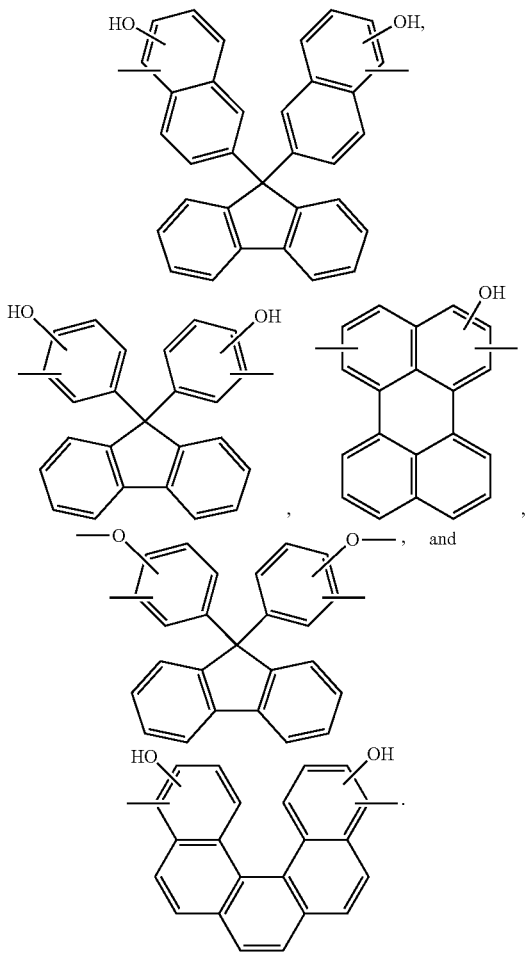

2. The spin-on hard mask composition of claim 1, wherein the weight average molecular weight of the polymer is 3,500 to 7,000.

3. The spin-on hard mask composition of claim 2, wherein the weight average molecular weight of the polymer is 5,000 to 6,000.

4. The spin-on hard mask composition of claim 1, wherein the hard mask composition comprises the dibenzo carbazole derivative polymer, an organic solvent, and a surfactant.

5. The spin-on hard mask composition of claim 4, wherein the polymer is contained in an amount of 1 to 50 wt % based on a total amount of the composition.

6. The spin-on hard mask composition of claim 4, wherein the organic solvent is contained in an amount of 50 to 99 wt % based on a total amount of the composition.

7. The spin-on hard mask composition of claim 4, wherein the surfactant is contained in an amount of 0 to 2 wt % based on a total amount of the composition.

8. The spin-on hard mask composition of claim 4, wherein the organic solvent is any one or a mixture of two or more selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

9. The spin-on hard mask composition of claim 4, wherein the surfactant is any one or a mixture of two or more selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

10. The spin-on hard mask composition of claim 4, wherein, based on a total amount of the composition, the polymer is contained in an amount of 1 to 50 wt %, the organic solvent is contained in an amount of 50 to 99 wt %, and the surfactant is contained in an amount of 0 to 2 wt %.

11. The spin-on hard mask composition of claim 10, wherein the organic solvent is any one or a mixture of two or more selected from the group consisting of propylene glycol monomethylether (PGME), propylene glycol monomethylether acetate (PGMEA), cyclohexanone, γ-butyrolactone, ethyl lactate (EL), methyl ethyl ketone, n-butyl acetate, N-methylpyrrolidone (NMP), methyl 3-methoxypropionate (MMP), ethyl 3-ethoxypropionate (EEP), and dimethylformamide (DMF).

12. The spin-on hard mask composition of claim 10, wherein the surfactant is any one or a mixture of two or more selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene lauryl ethers, and polyoxyethylene sorbitans.

13. A patterning method, comprising forming a hard mask layer by applying the hard mask composition of claim 1 on an etching layer through spin coating and performing a baking process.

14. The patterning method of claim 13, wherein the baking process is performed at a temperature of 150° C. to 400° C. for 1 min to 5 min, thus forming the hard mask layer.

* * * * *